United States Patent [19]

Magner

[11] Patent Number: 5,268,742
[45] Date of Patent: Dec. 7, 1993

[54] FULL APERTURE INTERFEROMETRY FOR GRAZING INCIDENCE OPTICS

[75] Inventor: Joann Magner, Danbury, Conn.

[73] Assignee: Hughes Aircraft Company, Los Angeles, Calif.

[21] Appl. No.: 898,855

[22] Filed: Jun. 15, 1992

[51] Int. Cl.⁵ .............................................. G01B 11/24
[52] U.S. Cl. .................................... 356/360; 356/359; 356/376; 356/345; 356/388; 356/124; 356/127
[58] Field of Search ............... 356/360, 345, 359, 355, 356/357, 376, 388, 379, 124, 125, 127

[56] References Cited

U.S. PATENT DOCUMENTS 4,820,049 4/1989 Biegen .................................. 356/360

*Primary Examiner*—Samuel A. Turner
*Assistant Examiner*—LaCharles P. Keesee
*Attorney, Agent, or Firm*—Michael W. Sales; Wanda K. Denson-Low

[57] ABSTRACT

A grazing incidence interferometer (1) includes a laser (10) and a beamsplitter (16) for splitting an output of the laser into a reference beam (B) and into a sample beam (A). A surface (18) to be examined is disposed at a first angle such that the sample beam is incident on and reflects from the surface at an angle of incidence other than normal, thereby providing a grazing incidence configuration. A beam combiner (22) combines the reference beam and the sample beam that reflects from the surface into a combined beam (C). An image plane (24) is disposed for receiving the combined beam such that an interference pattern is formed at the image plane. The image plane is disposed at a second angle to the combined beam, the second angle being selected to compensate for a reduction in an aspect ratio of the interference pattern that results from the surface being disposed at the first angle. The second angle may be approximately equal to the first angle, or may differ from the first angle to obtain a desired aspect ratio.

16 Claims, 5 Drawing Sheets

FULL APERTURE INTERFEROMETRY FOR GRAZING INCIDENCE OPTICS

FIELD OF THE INVENTION

This invention relates generally to optical metrology systems and, in particular, to optical metrology systems that employ interferometric techniques.

BACKGROUND OF THE INVENTION

Grazing or "skip" interferometry is a known optical metrology technique wherein an optic of interest is tested at a non-normal angle of incidence to a surface of the optic. One drawback to this technique is that as the angle of grazing incidence increases, the foreshortening of an image in an evaluation plane is increased, with a corresponding loss of lateral resolution in the direction of grazing incidence. Unfortunately, the direction of grazing incidence is often the direction wherein the greatest surface measurement accuracy is required.

An advantage of using interferometry over other known grazing incidence metrology techniques, such as fringe scanning or profilometry, is that a complete measurement of the entire surface of the optic of interest is obtained at one time, as opposed to requiring several scans that must later be combined, or "stitched" together. In general, stitching is a process of taking several data scans and subsequently combining the scans to obtain a map of the entire surface of the optic.

A further disadvantage of the conventional fringe scanning technique is a requirement of providing a reference optic of the same geometric form, and better surface quality, than the optic under test. In contradistinction, a grazing incidence interferometer may be set up using only flat and spherical optics, which are generally more readily obtainable and more readily characterized than a special purpose reference optic.

As such, it can be realized that the use of grazing or skip interferometry is preferred in that it eliminates the requirement to stitch together the results of several measurements, and that it also eliminates a requirement of providing, aligning, and maintaining a high-quality, non-standard test optic.

It is thus an object of this invention to provide an interferometric grazing incidence technique that overcomes the problems resulting from a foreshortening of the image, and the corresponding loss of lateral resolution in the direction of grazing incidence.

SUMMARY OF THE INVENTION

The foregoing and other problems are overcome and the object of the invention is realized by optical metrology apparatus, specifically a grazing incidence interferometer that is constructed in accordance with the invention.

The interferometer includes a source of coherent radiation and a beamsplitter for splitting an output of the source into a reference beam and into a sample beam. A surface to be examined is disposed at a first angle such that the sample beam is incident on and reflects from the surface at an angle of incidence other than normal, thereby providing a grazing incidence configuration.

A beam combiner is provided to combine into a combined beam the reference beam and the sample beam that reflects from the surface. An image plane is disposed for receiving the combined beam such that an interference pattern is formed at the image plane.

In accordance with the invention the image plane is disposed at a second angle to the combined beam, the second angle being selected to compensate for a reduction in an aspect ratio of the interference pattern that results from the surface being disposed at the first angle. The second angle may be approximately equal to the first angle, or may differ from the first angle to obtain a desired aspect ratio.

In one exemplary embodiment the grazing incidence interferometer has a Mach-Zender configuration, and the sample beam reflects once from the surface. In a second exemplary embodiment the grazing incidence interferometer has a Fizeau configuration, and the sample beam reflects twice from the surface. For this latter configuration a retroreflector is provided for directing the once reflected sample beam back towards the surface to be twice reflected therefrom. Further embodiments of the invention are disclosed in the context of phase measuring interferometers.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
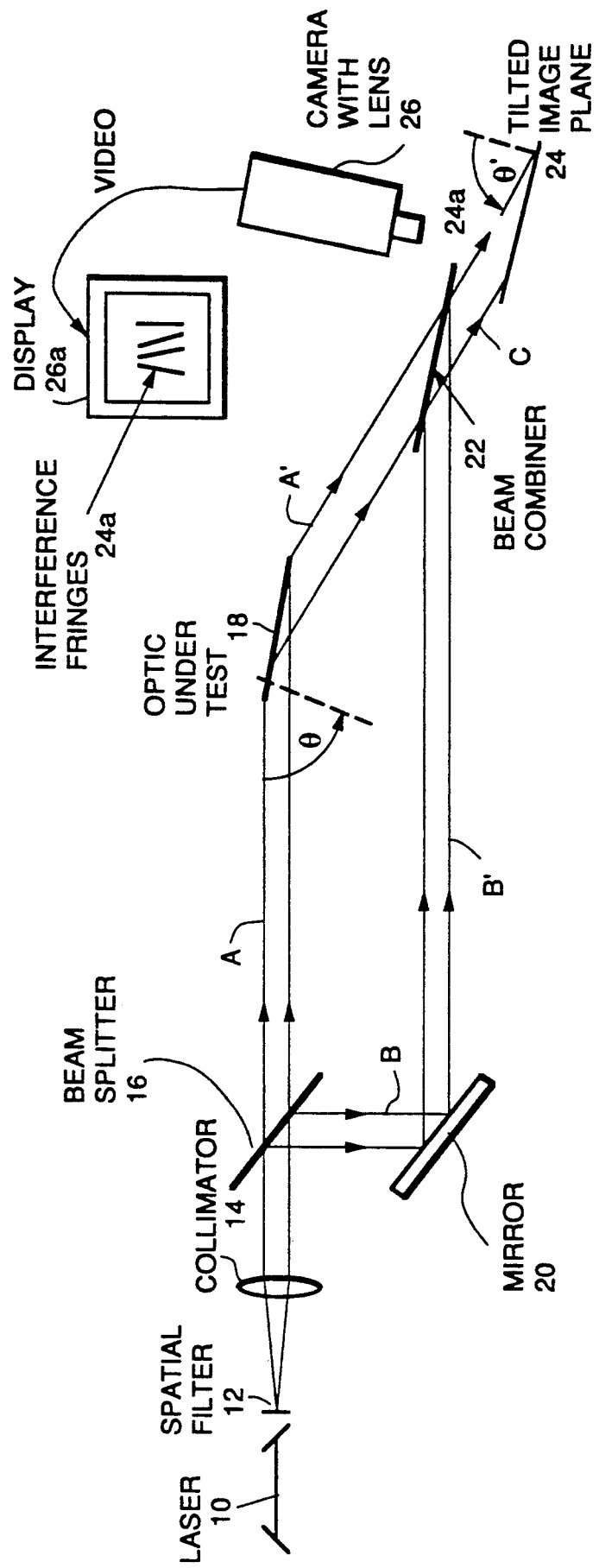
FIG. 1 is a schematic diagram of a Mach-Zender interferometer embodiment that incorporates the teaching of the invention.

FIG. 1 is a schematic diagram of a Mach-Zender interferometer 1 that incorporates the teaching of the invention. The interferometer includes a source of coherent radiation embodied in a laser 10. An output of the laser 10 is applied to a spatial filter 12 which operates in a conventional manner to remove frequency domain noise from the laser 10 output. The spatial filter 12 produces a diverging beam that is collimated by a collimator 14 and applied to a beam splitter 16. The beam splitter 16 produces a sample beam (A) that is incident on a surface of an optic under test (OUT) 18. The OUT 18 is inclined at an angle $\theta$ from a plane (P) that is perpendicular to the sample beam A. As a result, the sample beam A is incident on the OUT 18 at a non-normal (other than 9°) angle, such that the sample beam A "grazes" the surface of the OUT 18.

Beam splitter 16 also produces a reference beam (B) that is incident on a mirror 20. Beams A' and B', reflecting from the OUT 18 and the mirror 20, respectively, converge at a beam combiner 22 that produces a combined sample and reference beam (C). Beam C is incident on an image plane 24 where constructive and destructive interference between the sample and reference beams results in the production of an interference pattern, or interferogram 24a. The interferogram 24a may be directly recorded at the image plane 24, or the interferogram 24a may be imaged by a camera 26, which may contain a conventional CCD array, and displayed to an operator on a display 26a. The characteristics of the interferogram 24a is indicative of the surface characteristics of the OUT 18, which is the desired result.

In accordance with the teaching of the invention the image plane 24 is tilted by an angle $\theta'$, with respect to a plane that is normal to the incident sample beam A' so as to obtain a more accurate aspect ratio between the length and width of the OUT 18 in the interferogram image at the image plane 24. This restoration of the correct aspect ratio provides a lateral resolution comparable to that of standard (normal) incidence interferograms.

In general, $\theta'$ is approximately equal to $\theta$ so as to obtain the desired correction of the aspect ratio of the interferogram.

Figure 5A:
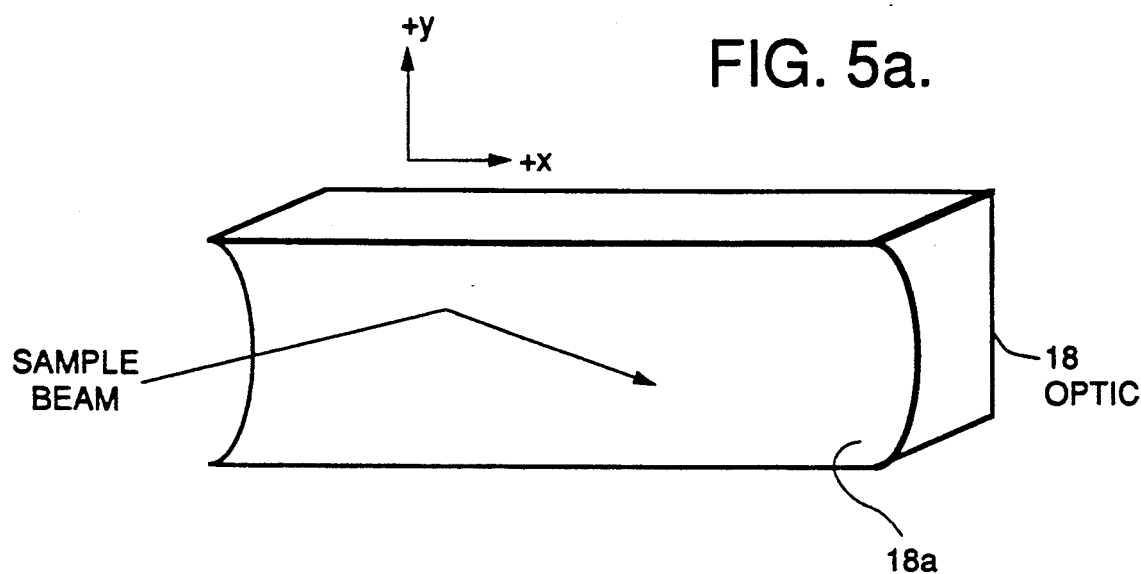
FIG. 5b illustrates an interferogram obtained from the grazing incidence optic of FIG. 5a with a conventional grazing incidence interferometer.
FIG. 5c illustrates an interferogram obtained with a grazing incidence interferometer that is constructed in accordance with the invention so as to compensate for a change in aspect ratio due to the non-normal angle of incidence of a sample beam upon a surface of an optic being characterized.
Figure 5B:
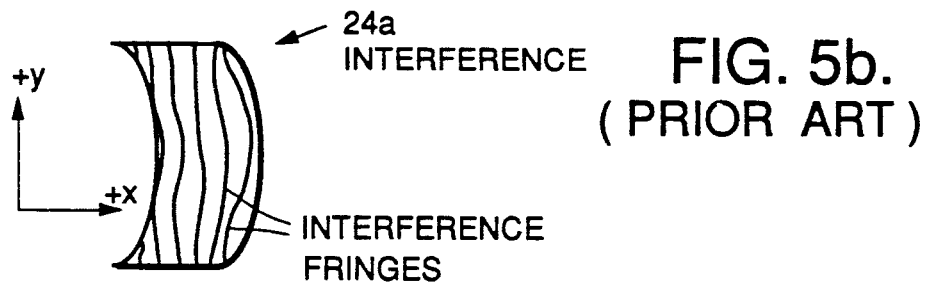
Figure 5C:
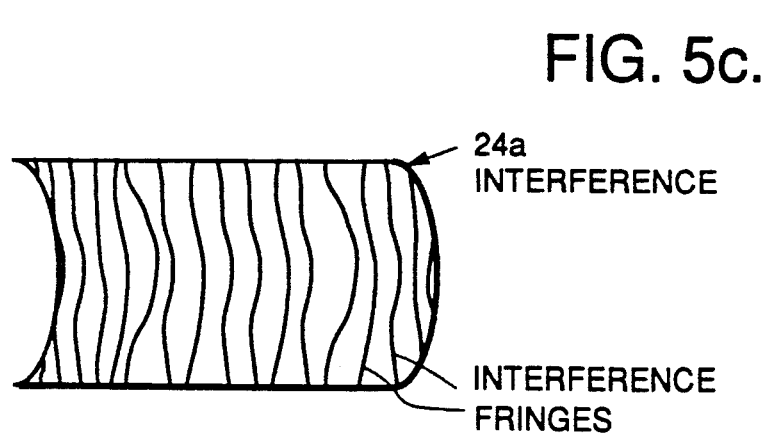

FIG. 5a illustrates a grazing incidence optic 18 having a concave surface 18a. FIG. 5b illustrates an interferogram obtained with a conventional grazing incidence interferometer, having an image plane normal to the sample beam, and shows the reduction is aspect ratio along the long axis of the optic, and the corresponding reduction in interferometric fringes or data. FIG. 5c illustrates an interferogram 24a obtained with the grazing incidence interferometer that is constructed in accordance with the invention. As can be seen, considerably more interference fringes are available for study, in that the inclination of the image plane 24 compensates for the reduction in aspect ratio due to the non-normal angle of incidence of the sample beam upon the surface of the optic 18. In FIGS. 5b and 5c the ends of the interferogram 24a are curved due to the imaging of the curved ends of the optic 18.

Figure 2:
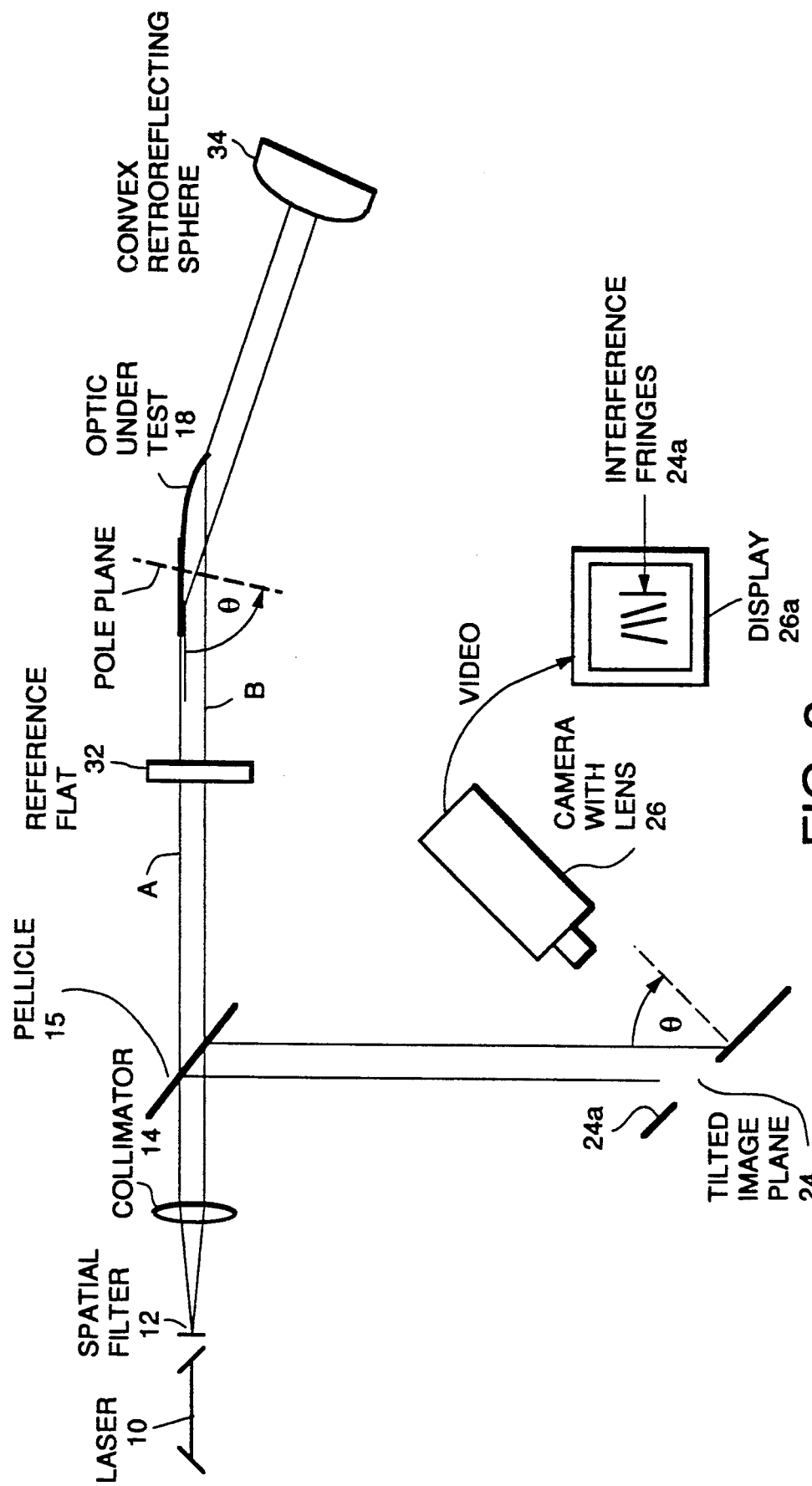
FIG. 2 is a schematic diagram of a Fizeau interferometer embodiment that incorporates the teaching of the invention.

FIG. 2 is a schematic diagram of a Fizeau interferometer 2 that incorporates the teaching of the invention, wherein components that function as in FIG. 1 are numbered accordingly.

The output of the laser 10 is applied to the spatial filter 12 which produces a diverging beam. The diverging beam is collimated by the collimator 14 and applied to a pellicle 15. The collimated beam is applied to a reference flat 32. The side of this reference flat 32 that is closest to the OUT 18 acts as a beamsplitter. The reflected beam creates the reference wavefront (B), and the transmitted beam is the sample beam (A) and is incident on the OUT 18. In this embodiment the OUT 18 has a parabolic shape, and is inclined at an angle from a pole plane of the parabolic OUT 18. After reflecting from the OUT 18 the sample beam is reflected by a convex retroreflecting sphere 34 back towards the OUT 18. As such, this is a double pass system, wherein the sample beam (A) reflects twice from the OUT 18. The twice reflected sample beam (A) passes back through the reference flat 32 where the twice reflected sample beam (A) is combined with the reference beam (B). The combined beams (A) and (B) reflect off of the pellicle 15 and are incident on the image plane 24 where the result of the constructive and destructive interference is observed as the interferogram 24a. The interferogram 24a may be imaged by the camera 26. As in the embodiment of FIG. 1, the characteristics of the interference pattern are indicative of the surface characteristics of the OUT 18, which is the desired result.

As in the embodiment of FIG. 1, and in accordance with the teaching of the invention, the image plane 24 is tilted by an angle $\theta'$ so as to obtain a more accurate aspect ratio between the length and width of the OUT 18 in the image at the image plane 24. In this embodiment of the invention, $\theta'$ is approximately equal to $\theta$. That is, the inclination of the image plane 24 is approximately equal to the inclination of the parabolic optic 18 away from the pole plane.

Figure 3:
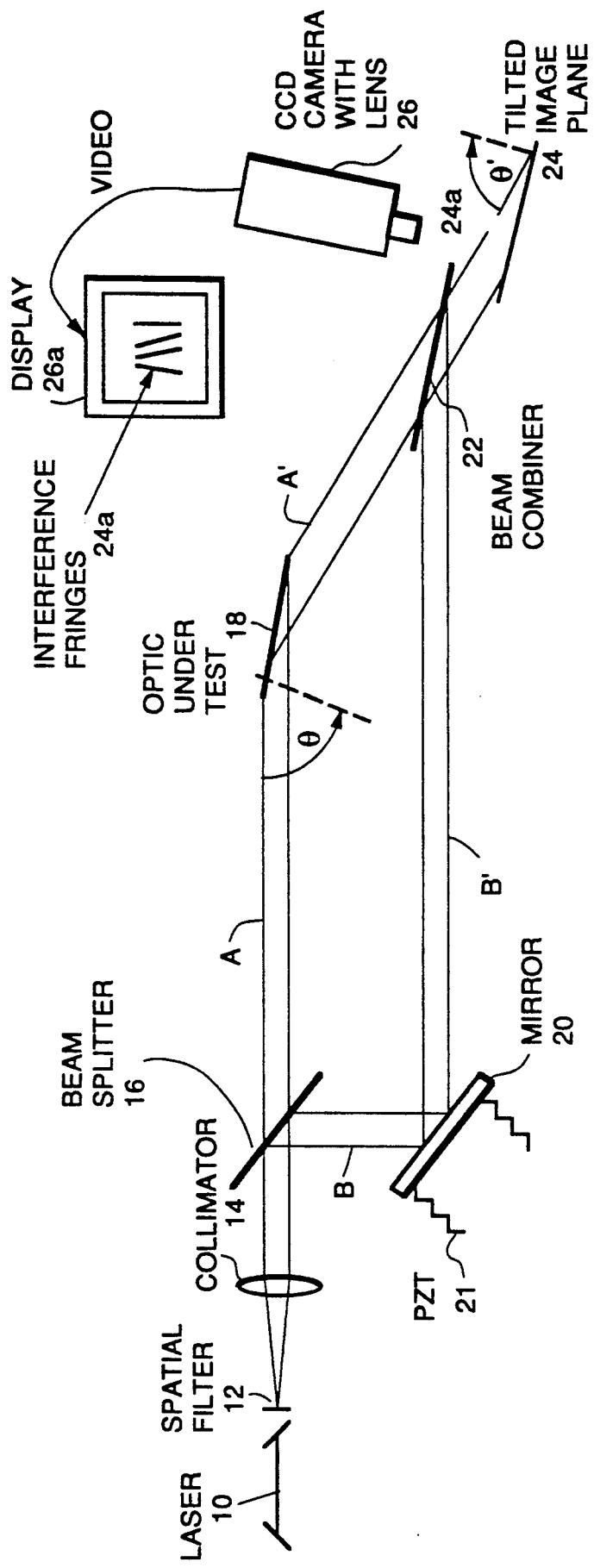
FIG. 3 is a schematic diagram of a Mach-Zender interferometer, configured as a phase measuring interferometer embodiment that incorporates the teaching of the invention.
Figure 4:
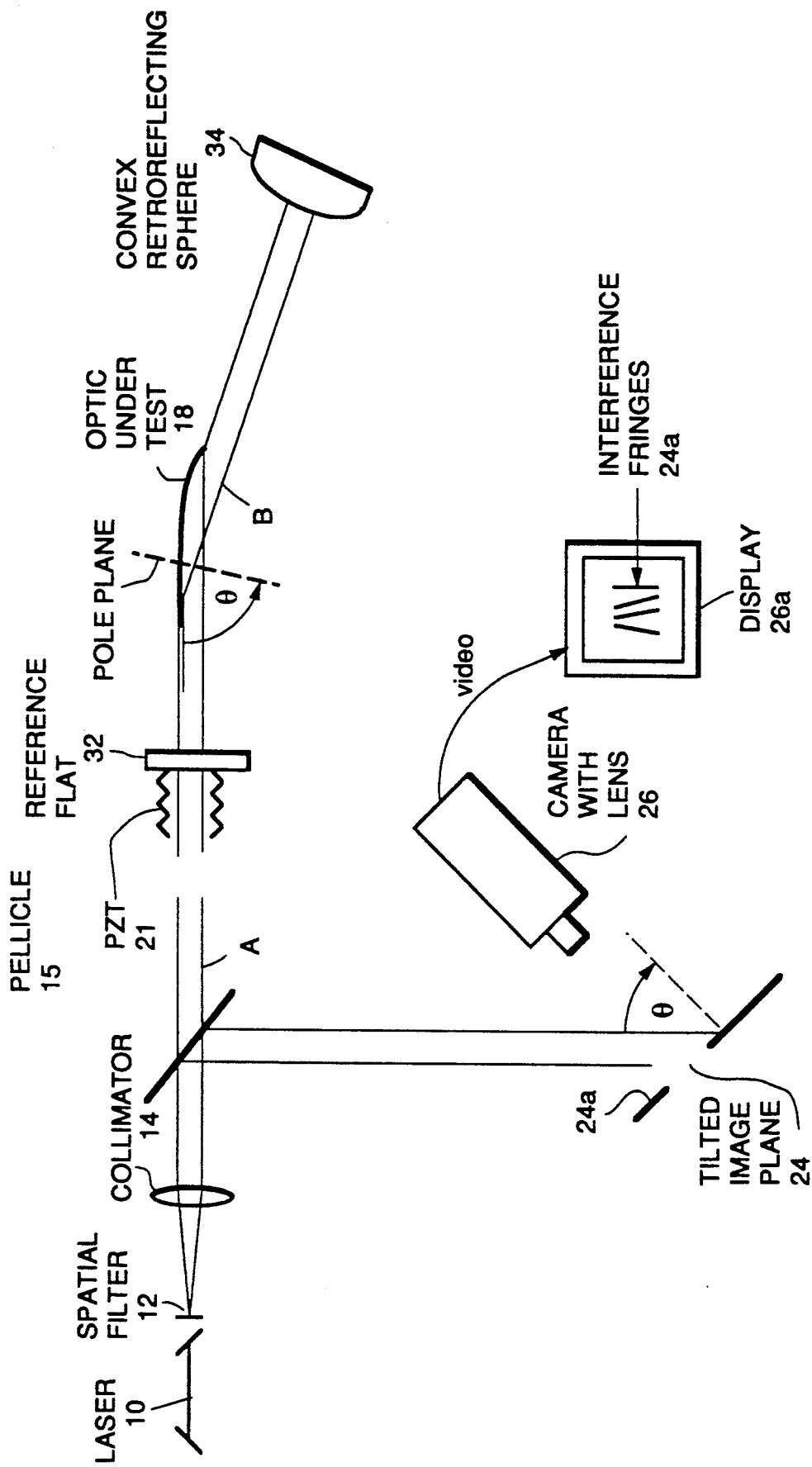
FIG. 4 is a schematic diagram of a Fizeau interferometer, configured as a phase measuring interferometer embodiment that incorporates the teaching of the invention.

The embodiments shown in FIGS. 3 and 4 are similar to FIGS. 1 and 2, respectively, with one difference being that these systems are configured to be phase measuring interferometers. In FIGS. 3 and 4 a PZT (piezo-electric transducer) 21 acts on the mirror 20 or reference flat 32 as appropriate, to cause a modulation of the interference pattern that is detected by the CCD camera 26. The modulated intensities are collected and combined in a known fashion to create an error map of the wavefront. This automatic data collection and reduction is used in place of human evaluation of the interference fringes.

It should be noted with respect to the embodiments of FIGS. 2 and 4 that if both the reference and the retroreflecting optic are flat, the retroreflecting optic can be adjusted to avoid reflecting off of the OUT 18 a second time. This renders the configuration single pass, which is less sensitive to errors on the surface of the optic under test than the two pass configuration. This can be advantageous in certain situations, especially when the optic is in the early stages of fabrication, and might not as yet be well figured.

A further advantage of the invention is that the accurate imaging of the entire optical surface being tested may be accomplished. With a conventional normal incidence image plane, accurate imaging of a grazing incidence object is often difficult or impossible to obtain, in that the ends of the optic under test are not in a single plane in a grazing incidence configuration. From geometric optics, if the optic under test is not in a single plane, the image will also not be in a single plane. Under certain circumstances, the separation of the end images can be reduced to the point of being negligible, but this does not often occur. However, the use of the invention overcomes this problem by tilting the image plane such that both ends of the optic under test can be simultaneously imaged.

It should be noted that due to the imaging characteristics of a selected configuration, left/right or top/bottom inversions may occur between object and image. Any such inversions are therefore taken into account in interpreting the interferogram.

The teaching of the invention has been described above in the context of exemplary interferometer embodiments, specifically a single pass, unequal path length Mach-Zender embodiment and a double pass, unequal path length Fizeau embodiment. It should be realized, however, that the teaching of the invention is not limited to use in only these two interferometer types and configurations. The actual configuration used is a function of the sensitivity to surface errors required and of the optic to be tested. In general, flat optics require both a flat reference optic and a flat retroreflecting optic. As seen in FIG. 2, parabolic optics are tested using a sphere (34) and a flat (32). Elliptic optics and hyperbolic optics are tested using spheres, and general conics are tested using combinations of flats and spheres.

Also, the angle of inclination of the image plane 24 may be other than an angle that is equal to the inclination of the test optic. That is, the actual inclination of the image plane 24 may be selected to obtain other than an optimum compensation of the aspect ratio of the interferogram.

Furthermore, it should be realized that the use of the invention is not limited for use only in the testing or characterization of grazing incidence optics for visible wavelengths, but may also be employed to advantage in testing or characterizing grazing incidence optics designed for use with radiation at other portions of the electromagnetic spectrum. For example, an interferometer constructed in accordance with the teaching of the invention may be employed for testing or characterizing a grazing incidence optic for use in an x-ra lithography system.

Thus, while the invention has been particularly shown and described with respect to exemplary embodiments thereof, it will be understood by those skilled in the art that changes in form and details may be made therein without departing from the scope and spirit of the invention.

What is claimed is:

1. Optical metrology apparatus for examining a surface, comprising:
   a source of coherent radiation; means for splitting an output of said source into a reference beam and into a sample beam, wherein a surface to be examined is disposed at a first angle such that the sample beam is incident on and reflects from the surface at an angle of incidence other than normal;
   means for combining into a combined beam the reference beam and the sample beam that reflects from the surface; and
   an image plane disposed for receiving the combined beam such that an interference pattern is formed at said image plane, said image plane being disposed at a second angle to the combined beam, the second angle being selected to compensate for a reduction in an aspect ratio of the interference pattern that results from the surface being disposed at the first angle.

2. Optical metrology apparatus as set forth in claim 1 wherein the first angle is approximately equal to the second angle.

3. Optical metrology apparatus as set forth in claim 1 wherein said splitting means includes a beamsplitter that is disposed for receiving the output of said source.

4. Optical metrology apparatus as set forth in claim 1 and further including camera means disposed for imaging the interference pattern.

5. Optical metrology apparatus as set forth in claim 1 and further including means for phase modulating the interference pattern.

6. A grazing incidence interferometer, comprising:
   a laser providing a coherent output beam;
   beamsplitter means disposed in said output beam for splitting the output beam into a reference beam and into a sample beam, wherein a surface to be examined is disposed at a first angle such that the sample beam is incident on and reflects from the surface at an angle of incidence other than normal;
   means for combining into a combined beam the reference beam and the sample beam that reflects from the surface; and
   an image plane disposed for receiving the combined beam such that an interferogram is formed at said image plane, said image plane being disposed at a second angle to the combined beam, the second angle being selected to compensate for a reduction in an aspect ratio of the interferogram that results from the surface being disposed at the first angle.

7. A grazing incidence interferometer as set forth in claim 6, wherein said interferometer has a Mach-Zender configuration, and wherein said sample beam reflects once from the surface.

8. A grazing incidence interferometer as set forth in claim 7 and further including a mirror disposed for reflecting the reference beam to said combining means.

9. A grazing incidence interferometer as set forth in claim 6, wherein said interferometer has a Fizeau configuration, and wherein said sample beam reflects twice from the surface.

10. A grazing incidence interferometer as set forth in claim 9 and further including a retroreflector disposed for reflecting the sample beam that reflects from the surface back towards the surface such that the sample beam reflects a second time from the surface.

11. A grazing incidence interferometer as set forth in claim 10 wherein the twice-reflected sample beam is directed back to said beamsplitter means, and wherein said beamsplitter means includes said combining means.

12. A grazing incidence interferometer as set forth in claim 9 and further including a reference flat that is interposed between said beamsplitter means and the surface.

13. A grazing incidence interferometer as set forth in claim 9 wherein the surface has a parabolic shape, and wherein said first angle is referenced to a pole plane of the surface.

14. A grazing incidence interferometer as set forth in claim 10 wherein the surface has a parabolic shape, and wherein said retroreflector has a spherical shape.

15. A grazing incidence interferometer as set forth in claim 6 and further including camera means disposed for imaging the interferogram.

16. A grazing incidence interferometer as set forth in claim 6 and further including means for phase modulating the interferogram.

* * * * *